United States Patent

Ohta

[11] Patent Number: 6,166,407
[45] Date of Patent: Dec. 26, 2000

[54] NON-VOLATILE SEMICONDUCTOR MEMORY DEVICE

[75] Inventor: Yoshiji Ohta, Kashiwara, Japan

[73] Assignee: Sharp Kabushiki Kaisha, Osaka, Japan

[21] Appl. No.: 09/138,848

[22] Filed: Aug. 24, 1998

[30] Foreign Application Priority Data

Oct. 21, 1997 [JP] Japan .................................. 9-288924

[51] Int. Cl.[7] .............................................. H01L 27/108
[52] U.S. Cl. .......................................... 257/298; 257/315
[58] Field of Search .............................. 257/71, 314, 300, 257/298, 315; 365/149

[56] References Cited

U.S. PATENT DOCUMENTS

| | | | |
|---|---|---|---|
| 5,331,188 | 7/1994 | Acovic et al. | 257/298 |
| 5,389,567 | 2/1995 | Acovic et al. | |
| 5,420,824 | 5/1995 | Kajimoto et al. | 365/230.01 |
| 5,442,210 | 8/1995 | Kanehachi | 257/296 |
| 5,444,652 | 8/1995 | Furuyama | 365/149 |
| 5,654,912 | 8/1997 | Hasegawa et al. | |
| 6,006,347 | 12/1999 | Churchill et al. | 714/724 |

FOREIGN PATENT DOCUMENTS 6-5801  1/1994  Japan .

Primary Examiner—Olik Chaudhuri
Assistant Examiner—Douglas A. Wille
Attorney, Agent, or Firm—Morrison & Foerster LLP

[57] ABSTRACT

A non-volatile semiconductor memory device includes: a memory cell section having a plurality of memory cells, each of the memory cells including a flash cell section and a DRAM capacitor section, the flash cell section having at least a drain, a source and a floating gate, the drain being connected to a bit line, the DRAM capacitor section having a capacitive element with two electrodes, one of the electrodes being connected to the source, and the other one of the electrodes being connected to a power supply terminal, and the memory cell being constructed in such a manner that electrons are injected into and extracted from the floating gate at least through the drain by a tunnel current; a register section connected to the memory cell section through the bit line; a bit line selector into which a signal from the bit line is input; and a sensing amplifier for receiving an output from the bit line selector as an input signal. According to the present invention, in the normal operation mode, it is possible to achieve a high-speed random access similar to the one in a general DRAM by reading out or rewriting the volatile data stored in the capacitive element section. On the other hand, in the data retaining mode, final information or invariable information can be stored in the non-volatile memory cell section as non-volatile data.

7 Claims, 5 Drawing Sheets

Writing operation as a DRAM

Reading operation as a DRAM

NON-VOLATILE SEMICONDUCTOR MEMORY DEVICE

CROSS-REFERENCE TO RELATED APPLICATIONS

This application is related to Japanese Patent Application No. HEI 09-288924 filed on Oct. 21, 1997 whose priority is claimed under 35 USC §119, the disclosure of which is incorporated herein by reference in its entirety.

BACKGROUND OF THE INVENTION

1. Field of the Invention

The present invention relates to a non-volatile semiconductor memory device and, more particularly, to a non-volatile semiconductor memory device in which each memory cell includes a non-volatile memory cell and a capacitive element, and which operates as a high-speed DRAM (Dynamic Random Access Memory) in a normal operation mode and operates as a non-volatile memory in a data retaining mode.

2. Description of the Related Art

Generally, there are two kinds of semiconductor memory devices. One is a non-volatile memory (such as EEPROM) in which stored contents are retained even after a power supply is turned off. The other is a volatile memory (such as RAM) in which the stored contents disappear when the power supply is turned off.

The non-volatile memory having the above-described advantage has been remarkably progressed and has reached flash memories having a large capacity which are applied to various kinds of commercial products. Generally, a period of time required for rewriting in non-volatile memories is relatively longer than that of random access memories such as DRAM or SRAM. In order to obtain at least some improvement, the following measures have been taken. For example, in flash memories of NOR type, a rewriting speed in each memory cell is made higher by employing a CHE (Channel Hot Electron) method. In flash memories of NAND type, the rewriting speed is made higher by rewriting a large number of cells in parallel by using FN (Fowler Nordheim) tunnel current.

However, in conventional non-volatile memories such as a flash memory of NOR type or a flash memory of NAND type mentioned above, the shortest available period of time required for rewriting is about 1 $\mu$s/ byte. This period of time is longer than the rewriting speed of DRAM or SRAM, which is about several ten nano second.

Thus, there has been an eager desire for the development of a non-volatile semiconductor memory device which can retain the above advantage as a non-volatile memory and which can allow a high-speed random access to such an extent as in an ordinary DRAM.

SUMMARY OF THE INVENTION

The present invention provides a non-volatile semiconductor memory device comprising: a memory cell section having a plurality of memory cells, each of the memory cells including a flash cell section and a DRAM capacitor section, the flash cell section having at least a drain, a source and a floating gate, the drain being connected to a bit line, the DRAM capacitor section having a capacitive element with two electrodes, one of the electrodes being connected to the source, and the other one of the electrodes being connected to a power supply terminal, and the memory cell being constructed in such a manner that electrons are injected into and extracted from the floating gate at least through the drain by a tunnel current; a register section connected to the memory cell section through the bit line; a bit line selector into which a signal from the bit line is input; and a sensing amplifier for receiving an output from the bit line selector as an input signal.

BRIEF DESCRIPTION OF THE DRAWINGS

The present invention will be better understood from the following detailed description of preferred embodiments of the invention, taken in conjunction with the accompanying drawings, in which.

DETAILED DESCRIPTION OF THE PREFERRED EMBODIMENTS

Figure 1:
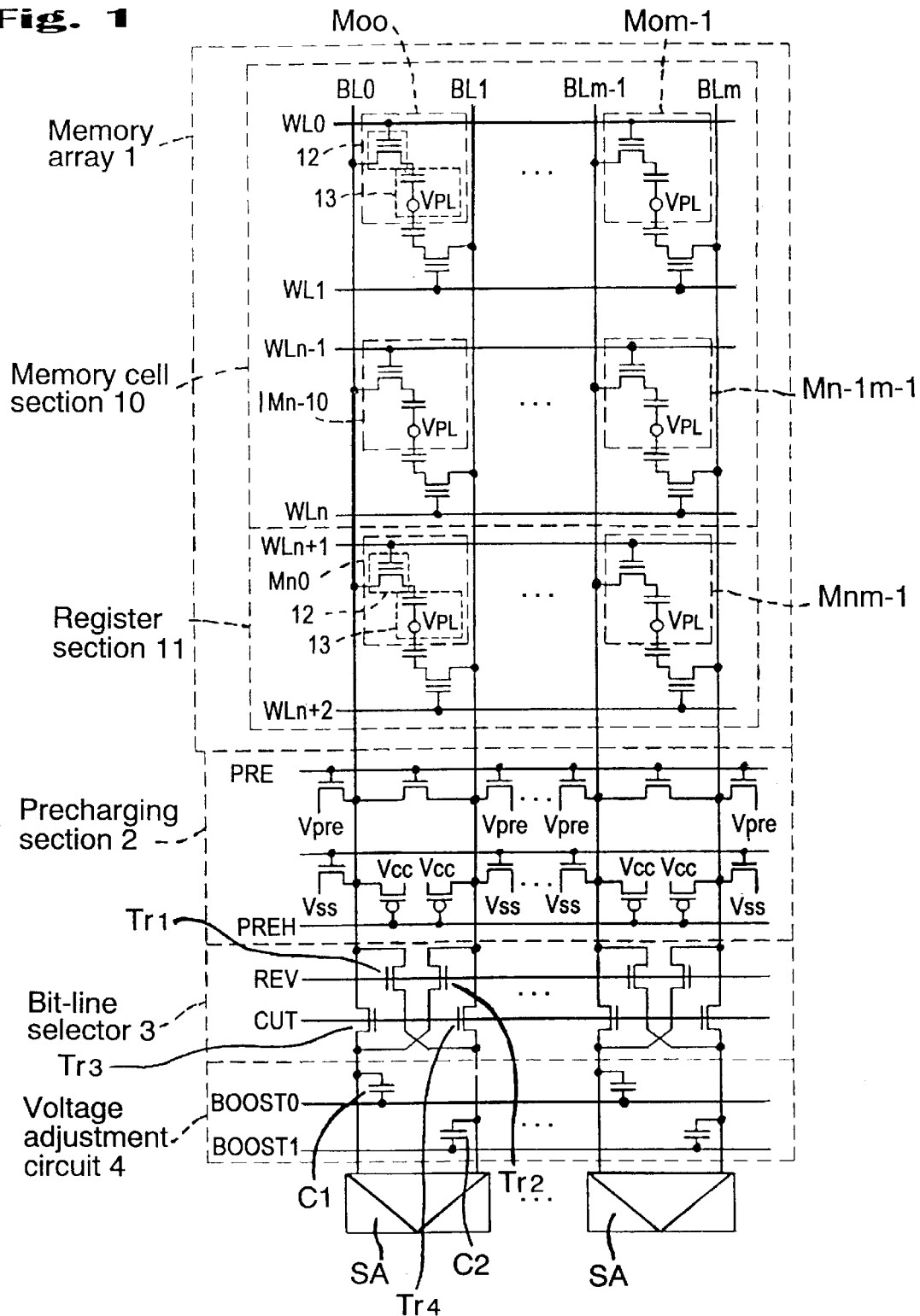
FIG. 1 is a circuit diagram showing a construction of a non-volatile semiconductor memory device according to the present invention.

The non-volatile semiconductor memory device of the present invention mainly includes the memory cell section, the register section, the bit line selector and the sensing amplifier.

The memory cell section includes the flash cell section and the DRAM capacitor section.

The flash cell section has at least the drain, the source and the floating gate. The drain is connected to the bit line. The flash cell section is preferably formed of a non-volatile memory transistor. The non-volatile memory transistor generally includes a first dielectric film, the floating gate, a second dielectric film and a control gate, which are successively formed on a semiconductor substrate, and source/drain formed in the semiconductor substrate. The first dielectric film is generally referred to as a tunnel dielectric film and may be formed of a silicon oxide film, a nitrogen-containing silicon oxide film or the like. The thickness of the first dielectric film may be suitably adjusted depending on a voltage applied in operating the transistor, or the like. The floating gate is preferably formed of a material capable of suitably accumulating an electric charge, such as polysilicon or silicon nitride film. The thickness of the floating gate is not specifically limited. In the present invention, the floating gate functions as an electric charge accumulating layer for accumulating an electric charge and may be formed of a layer having a lot of traps, such as a two-layer structure of SiN—$SiO_2$ or a three-layer structure of $SiO_2$—SiN—$SiO_2$ in addition to the above materials. The second dielectric film is formed between the floating gate and the later-mentioned control gate and may be formed of a material similar to that of the first dielectric film. The material for the control gate is not specifically limited as long as it can be used generally as an electrode material. The control gate may be formed of polysilicon, silicide, polycide or one of various metals to a desired thickness to cover the floating gate completely or partially so that the injection of electrons into the floating gate can be controlled. The source/drain are formed to contain a P-type impurity or an N-type impurity. The source/drain are preferably formed in symmetry with the same impurity concentration for ease of manufacturing processes. However, the drain may have an impurity concentration higher than that of the source, or the source and the drain may be non-symmetrically positioned relative to the floating gate in order to facilitate injection/extraction of electrons into/from the floating gate at least through the drain of the non-volatile memory transistor.

Also, in the non-volatile memory transistor, the first dielectric film may be formed to have an uneven thickness such that a portion of the first dielectric film near the drain has a smaller thickness than a portion of the first dielectric film near the source in order to facilitate injection/extraction of electrons into/from the floating gate at least through the drain of the non-volatile memory transistor.

The non-volatile memory transistor of the present invention may be achieved by either of an N-type transistor and a P-type transistor.

The DRAM capacitor section is preferably formed of a capacitor that is generally used as a capacitive element. The capacitor generally has a structure in which a capacitor dielectric film is interposed between two electrodes, for example, between an accumulation electrode and a plate electrode. The material for the capacitor dielectric film is not specifically limited. The capacitor dielectric film may be formed of, for example, silicon oxide film, silicon nitride film, a laminated film of these films or the like to an arbitrary thickness. The accumulation electrode may be formed of any material to any thickness as long as it can be generally used as an electrode, as mentioned above. Here, although the accumulation electrode is electrically connected to the source of the non-volatile memory transistor, the accumulation electrode may instead be formed integrally with the source as a common diffusion layer formed in the semiconductor substrate. The plate electrode may be formed of a material similar to that of the accumulation electrode and may be formed to have an arbitrary thickness. Here, although the plate electrode may be formed for each memory cell, the plate electrode of a memory cell is preferably formed integrally with plate electrodes of a plurality of adjacent memory cells.

In the memory cell section constructed as above, electrons are injected into and extracted from the floating gate at least through the drain by a tunnel current This injection/extraction of electrons may be achieved by an arbitrary combination of the above memory cell section and optionally a register section, a bit line selector and/or a sensing amplifier; and further optionally, one or more of a voltage adjustment circuit, a bit line decoder, a precharging latch circuit, a multiplexer, a word line decoder, a driver circuit, a timing circuit and the like. Here, the bit line decoder, the precharging latch circuit, the multiplexer, the word line decoder, the driver circuit and the timing circuit may be formed of known ones.

The injection/extraction of electrons into/from the floating gate at least through the drain by a tunnel current means that the injection/extraction of electrons is performed at least between the drain and the floating gate. For example, if the non-volatile memory transistor is in an ON state, a channel is formed in a surface of the semiconductor substrate immediately under the floating gate, so that the electrons are injected into or extracted from the floating gate also through this channel. Accordingly, the electron injection/extraction referred to in the present invention may include injection/extraction of electrons into/from the floating gate through the drain and a part or whole of the channel or through the entire surface area extending from the drain to the source.

The bit line to which the drain in the memory cell is connected preferably constitutes one of a pair of complementary bit lines.

The register section can be connected to the memory cell section via the bit line. The register section may include the flash cell section and the DRAM capacitor section constituting the memory cell in a manner similar to the memory cell section. Also, the drain of the non-volatile memory transistor constituting the flash cell section may be connected to the bit line; the source of the non-volatile memory transistor may be connected to one of the electrodes of the capacitive element constituting the DRAM capacitor section; and the other of the electrodes of the capacitive element may be connected to the power supply terminal. Alternatively, the DRAM cell may include the transistor formed of the flash cell section without a floating gate, and the capacitive element.

The bit line selector is constructed in such a manner that a signal from the bit line is input into the bit line selector and this signal is input into the sensing amplifier, as mentioned later. The bit line selector connects a pair of complementary bit lines to, for example, first and second input terminals of the sensing amplifier. For that purpose, the bit line selector may include a pair of transistors connecting one of the pair of complementary bit lines to the first input terminal of the sensing amplifier and connecting the other one of the pair of complementary bit lines to the second input terminal of the sensing amplifier, and another pair of transistors connecting said one of the pair of complementary bit lines to the second input terminal of the sensing amplifier and connecting said other one of the pair of complementary bit lines to the first input terminal of the sensing amplifier.

The sensing amplifier receives an output from the bit line selector as an input, whereby the information in the memory cell is detected and amplified.

A voltage adjustment circuit may be provided between the memory cell array and the sensing amplifier connected to the memory cell array for changing an input voltage of the sensing amplifier. The voltage adjustment circuit may include capacitive elements respectively connected to the first and second input terminals of the sensing amplifier. The capacitive elements in the voltage adjustment circuit may have a construction similar to those constituting the DRAM capacitor section.

The present invention is now detailed by way of examples shown below in conjunction with the attached drawings, which are not intended to limit the scope of the present invention.

EXAMPLE 1

Referring to FIG. 1, a non-volatile semiconductor memory device includes a memory array 1 having a number of memory cells M arranged in a matrix-like configuration, a precharging circuit 2, a bit line selector 3, a voltage adjustment circuit 4, and a sensing amplifier SA.

As shown in FIG. 1, the memory array 1 includes a memory cell section 10 and a register section 11. The memory cell section 10 includes n×m memory cells M arranged in a matrix-like configuration. Each of the memory cells M is constructed in such a manner that a flash cell section 12 having one non-volatile memory transistor is connected to a DRAM capacitor section 13 having one capacitor. The register section 11 includes similar memory cells M arranged in a lateral direction in an area adjacent to the memory cell section 10. A drain of the flash cell section 12 is connected to the bit line BL, and a source of the flash cell section 12 is connected to one end of the DRAM capacitor section 13. Further, a voltage terminal (a plate voltage $V_{PL}$ of the DRAM capacitor section 13) is connected to the other end of the DRAM capacitor section 13.

More specifically explained, word lines WL (WL0 to WLn+2) are wired in a lateral direction and bit lines BL (BL0 to BLm) are wired in a longitudinal direction on a substrate (not shown). Each of the memory cells M is disposed in an area surrounded by two adjacent word lines WL and two adjacent bit lines BL. Thus, the memory cells M are arranged in a matrix-like configuration. Here, the areas surrounded by the word lines WL0 to WLn and the bit lines BL0 to BLm constitute the memory cell section 10, and the areas surrounded by the word lines WLn+1 to WLn+2 and the bit lines BL0 to BLm constitute the register section 11.

The bit line selector 3 includes two pair of transistors. In one pair of transistors, i.e., transistors Tr1 and Tr2, the transistor Tr1 connect a bit line BL to a second input terminal of the sensing amplifier SA and the transistor Tr2 connect another bit line BL, which is complementary to the above bit line BL, to a first input terminal of the sensing amplifier SA respectively. In another pair of transistor, i.e., transistors Tr3 and Tr4, the transistor Tr3 connect the bit line BL to the first input terminal of the sensing amplifier SA and the transistor Tr4 connect another bit line BL, which is complementary to the above bit line BL, to the second input terminal of the sensing amplifier SA respectively.

The voltage adjustment circuit 4 includes capacitive elements C1, C2 respectively connected to the first and second input terminals of the sensing amplifier SA.

In accordance with the above structure, non-volatile data are stored in the flash cell section 12 and volatile data are stored in the DRAM capacitor section 13. For example, in this non-volatile semiconductor memory device, the flash cell section 12 can be operated as a non-volatile memory by applying voltages shown in the following table 1.

TABLE 1

|  | reading | program | erasing |
|---|---|---|---|
| word line | +3 V | −10 V | +16 V |
| bit line | +1.5 V | +3 V | 0 V |

Hereafter, an explanation will be given on various operations of the non-volatile semiconductor memory device constructed as above, namely, a writing operation as a DRAM, a reading operation as a DRAM, a recalling operation, a storing operation, a verifying operation and a refreshing operation.

The following explanation of the operations mainly refers to operations in a destructive mode, i.e. operations in which the non-volatile data are not retained when the memory cell M operates as a DRAM. However, since the non-volatile semiconductor memory device of the present invention can be operated also in a non-destructive mode, explanation of the operations in the non-destructive mode will also be given at an appropriate time.

Writing Operation as a DRAM

First, the writing operation as a DRAM will be explained with reference to FIG. 2. This writing operation as a DRAM is similar to the writing operation of a general DRAM. In accordance with "0" or "1" of the data, the bit lines BL and BL# are set to have voltages Vcc or Vss (See (a) and (b) of FIG. 2), and a s,elected word line (for example, word line WL0) is raised to a voltage of Vcc+Vth or more and then lowered after a predetermined period of time (See (c) of FIG. 2). Through this operation, predetermined data are stored in the DRAM capacitor section 14 of the corresponding memory cell M.

Reading Operation as a DRAM

Figure 3:
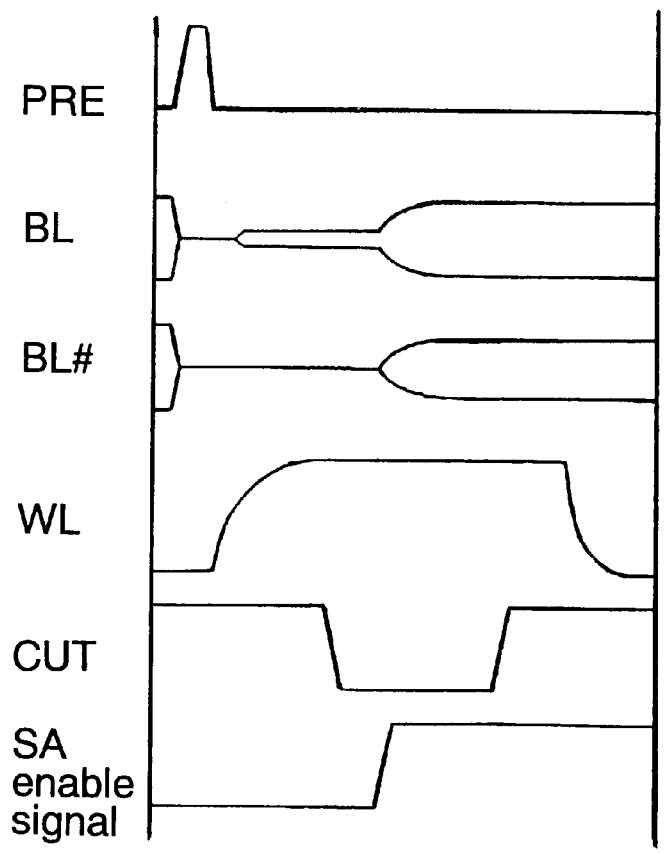
FIG. 3 is a timing chart showing a reading operation as the DRAM according to the present invention.

Next, the reading operation as a DRAM will be explained with reference to FIG. 3. This reading operation as a DRAM is also similar to the reading operation of a general DRAM. The precharging signal PRE of the precharging circuit 2 is raised for a predetermined period of time (See (a) of FIG. 3) to precharge all the bit lines BL0 to BLm to a voltage of Vcc/2 (the precharging voltage Vpre for reading in FIG. 1) (See (b) and (c) of FIG. 3). Thereafter, a selected word line WL (for example, WL0) is raised to a voltage of Vcc (a power supply voltage of the device) +Vth or more (See (d) of FIG. 3). Subsequently, after a bit line separation signal CUT of the bit line selector 3 is lowered as shown by (e) of FIG. 3, the sensing amplifier SA is actuated. Namely, the sensing amplifier SA is activated by giving an enable signal to the sensing amplifier SA as shown by (f) of FIG. 3. Through this operation, the data in all the memory cells M (M00 to M0m−1) connected to the word line WL0 are read out.

In this sensing operation, only the differential amplification generally used in a conventional DRAM is carried out. Thus, the sensing operation is not accompanied by a voltage step-up operation which is used in an operation for reading the non-volatile data in the flash cell section 12 as described in the second stage of the later-explained recalling operation.

Recalling Operation

Figure 4:
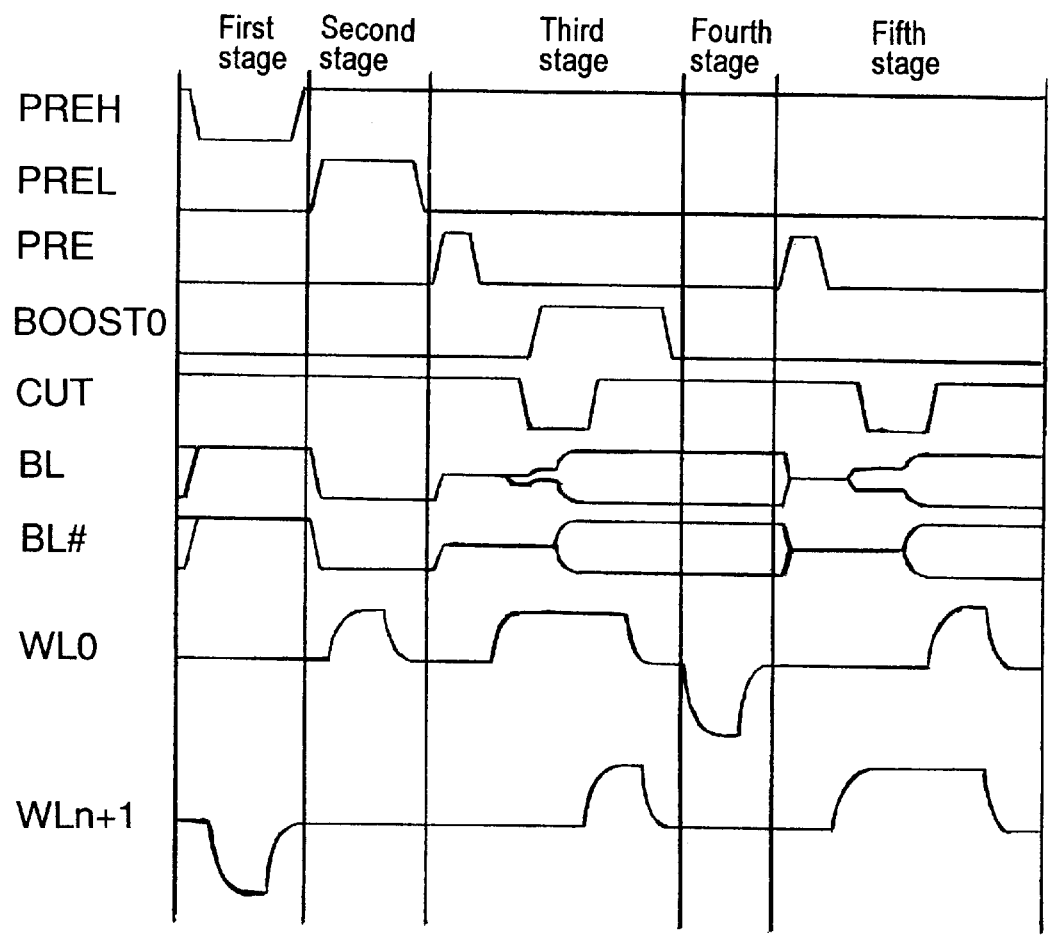
FIG. 4 is a timing chart showing a recalling operation according to the present invention.

Next, with reference to FIG. 4, the recalling operation in the non-volatile semiconductor memory device according to the example 1 of the present invention is now explained. Here, the recalling operation as used herein refers to an operation in which the non-volatile data stored in the flash cell section 12 of the memory cell M of the present invention are read out (temporarily stored) into the register section 11 for a while and then re-stored into the DRAM capacitor section 13 of the same memory cell M. However, depending on the application, the non-volatile data once read out into the register section 11 may be written into a memory cell M at another address.

This recalling operation is carried out through the following five stages (first stage to fifth stage), as shown in FIG. 4.

In the first stage, the threshold voltage of the flash cell section 12 of the memory cells M (Mn0 to Mnm−1) in the register section 11 is lowered beforehand in order to allow a DRAM operation of the register section 11. Namely, the precharging signal PREH of the precharging circuit 2 is lowered as shown by (a) of FIG. 4 to set all the bit lines BL0 to BLm to have a voltage of Vcc (See (f) and (g) of FIG. 4). Then, a negative voltage is applied for a predetermined period of time to word lines WLn+1, WLn+2 corresponding to the register section 11 (See (i) of FIG. 4). Here, if the threshold voltage of the flash cell section 12 of the memory cells M constituting the register section 11 is low, the first stage can be omitted.

Then, in the second stage, "0" data are written into all the memory cells as a preliminary step for reading the non-volatile data stored in the flash cell section 12 of the memory cells M. Namely, a precharging signal PREL of the precharging circuit 2 is raised (See (b) of FIG. 4) to set all the bit lines BL0 to BLm to have a voltage of Vss and all the word lines WL0 to WLn are raised to a voltage of Vcc See (h) of FIG. 4), thereby to store the "0" data into the DRAM capacitor section 13. However, "0" data are not written into memory cells having a high threshold voltage in the flash cell section 12.

Next, in the third stage, the non-volatile data stored in the flash cell section 12 of the memory cell section 10 are read out and transferred to the register section 11. Namely, after a precharging signal PRE of the precharging circuit 2 is raised for a predetermined period of time (see (c) of FIG. 4) to precharge all the bit lines BL0 to BLm to a voltage of Vcc/2, a selected word line (for example, WL0) is raised to a voltage of Vcc (See (h) of FIG. 4).

In the third stage, in a similar manner as in the second stage, it is not necessary that the voltage of the word lines WL0 to WLn is raised to Vcc+Vth or more, which is required in the above-described reading operation as a DRAM. This is because only the "0" data of Vss have been written into the DRAM capacitor section 13 and the problem of threshold voltage fall does not occur.

Here, if the threshold voltage of the flash cell section 12 of the selected memory cell M is high, namely if the non-volatile data is "1", the memory cell M is not turned ON, so that the bit lines BL to BLm are held at the precharging voltage. On the other hand, if the threshold voltage of the flash cell section 12 of the selected memory cell M is low, namely if the non-volatile data is "0", the memory cell M is turned ON, so that the bit lines BL to BLm fall from the precharging voltage by a predetermined voltage $\Delta V$. This predetermined voltage $\Delta V$ is a voltage determined by the capacitance Cs of the DRAM capacitor section 13 and the bit line capacitance Cb, as shown by the following formula (1).

$$\Delta V = Vcc \cdot Cs/(Cb+Cs) \quad (1)$$

Next, the voltage step-up signal (for example, BOOST0) of the sensing amplifier input node of the voltage adjustment circuit 4 is raised (See (d) of FIG. 4) to raise the voltages of the bit lines BL and BL# by $\Delta V/2$ (See (f) and (g) of FIG. 4). Thereafter, by operating the sensing amplifier SA, the non-volatile data in the flash cell section 12 can be read out.

Here, the slight voltage to be sensed is $\Delta V/2$, which is half of the voltage $\Delta V$ to be sensed in the above-described reading operation as a DRAM. Therefore, it is sufficient to allow the operation speed of the sensing amplifier SA to be about a half in order to increase the sensing sensitivity and to allow differential amplification with precision. Even if the operation speed of the sensing amplifier is thus reduced, the period of time required for the sensing operation is about 20 ns, which is sufficiently smaller than the period of time (about 1 ms) required for changing the threshold voltage of the flash cell section 12. Therefore, the adverse effects on the total period of time required for the recalling operation can be ignored.

Subsequently, the non-volatile data in the flash cell section 12 of the memory cells M00 to M0m−1 connected to the word line WL0, for example, are written into the memory cells Mn0 to Mnm−1 connected to the word line WLn+1 of the register section 11 by raising a word line (for example, WLn+1) of the register section 11 to a voltage of Vcc+Vth or more and then lowering it after a predetermined period of time (See (i) of FIG. 4).

Next, in the fourth stage, the threshold voltage of the flash cell section 12 from which the non-volatile data have been read out is lowered so that the flash cell section 12 can be used as a transistor in a DRAM operation. Namely, with the bit line voltage kept in the state of being sensed, a negative voltage is applied for a predetermined period of time to a word line WL (for example, WL0) to be selected.

Here, if the threshold voltage is originally low, i.e. if the non-volatile data is "0", the threshold voltage does not fall further below that level because the bit line voltage is Vss. On the other hand, if the original threshold voltage is high, i.e. if the non-volatile data is "1", the threshold voltage falls because the bit line voltage is Vcc.

Next, in the fifth stage, the data temporarily stored in the memory cell M of the register section 11 are returned to the selected memory cell M of the memory cell section 10. Namely, the word line (for example, WLn+1) of the registering section 11 having the temporarily stored data is raised to a voltage of Vcc+Vth or more (See (i) of FIG. 4); the bit line separation signal CUT of the bit line selector 3 is lowered (See (e) of FIG. 4); and the sensing amplifier SA is actuated. Thereafter, the bit line separation signal CUT is raised, and the selected word line WL (for example, WL0) is raised to a voltage of Vcc+Vth or more and then is lowered after a predetermined period of time (See (h) of FIG. 4).

The recalling operation for all the memory cells M will be completed by conducting the processes from the third stage to the fifth stage for all the word lines WL. The memory cells M are then used as a DRAM.

Here, the explanation has been given on a mode in which the non-volatile data stored in the flash cell section 12 of the memory cell M are destroyed as a result of the recalling operation. However, a recalling operation of a non-destructive mode is possible if the word line voltage for the reading operation and the writing operation as a DRAM is set to have a voltage higher than the maximum threshold voltage of the flash cell section 12. to omit the fourth stage of the recalling operation.

Storing Operation

Next, the storing operation in the non-volatile semiconductor memory device according to the first embodiment is now explained with reference to FIG. 5. The storing operation refers to an operation in which the volatile data stored in the DRAM capacitor section 13 of the memory cell M of the memory cell section 10 are read out (temporarily stored) into the register section 11 and then re-stored into the flash cell section 12 at the same address.

Figure 5:
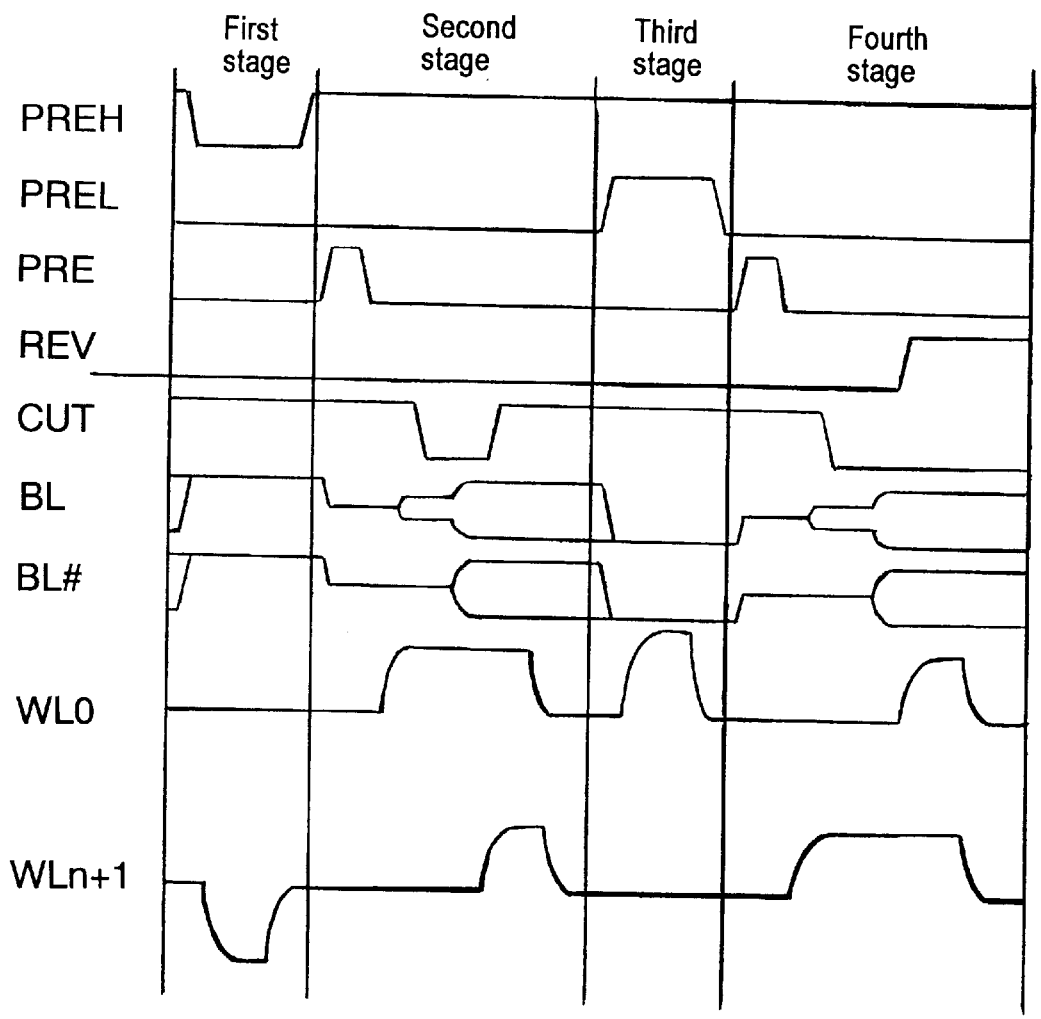
FIG. 5 is a timing chart showing a storing operation according to the present invention.

The storing operation is carried out through the first stage to the fourth stage, as shown in FIG. 5.

In the first stage, the threshold voltage of the flash cell section 12 of the memory cell M of the register section 11 is lowered so as to allow a DRAM operation of the register section 11. Namely, after the precharging signal PREH of the precharging circuit 2 is lowered (See (a) of FIG. 5) to set all the bit lines BL to have a voltage of Vcc (See (f) and (g) of FIG. 5), a negative voltage is applied to word lines WLn+1 and WLn+2 for a predetermined period of time (See (i) of FIG. 5). Here, the first stage can be omitted if it is ensured that the threshold voltage of the flash cell section 12 of the memory cell M of the register section 11 is low.

In the second stage, the volatile data stored in this DRAM capacitor section 13 of the memory cell M of the memory cell section 10 are read out and transferred to the register section 11. Namely, the precharging signal PRE of the precharging circuit 2 is raised for a predetermined period of time (See (c) of FIG. 5) to precharge all the bit lines BL0 to BLm to a voltage of Vcc/2 (See (f) and (g) of FIG. 5); a selected word line WL (for example, WL0) is raised to a voltage of Vcc+Vth or more (See (h) of FIG. 5); the bit line separation signal CUT of the bit line selector 3 is lowered (See (e) of FIG. 5); and the sensing amplifier SA is actuated.

Thereafter, the bit line separation signal CUT is raised, and a word line WL (for example, WLn+1) of the register section 11 is raised to a voltage of Vcc+Vth or more (See (h) of FIG. 5) and then is lowered after a predetermined period of time. Through this step, the volatile data in the DRAM capacitor section 13 of the memory cell M connected to the word line WL0, for example, are written into the register section 11, for example, a memory cell M connected to the word line WLn+1.

Next, in the third stage, the threshold voltage of the flash cell section 12 is raised for a while as a preliminary step for writing the data transferred to and temporarily stored in the register section 11 into the flash cell section 12 of the memory cell M from which the data have been read out. Namely, the precharging signal PREL of the precharging circuit 2 is raised (See (b) of FIG. 5) to set all the bit lines BL to have a voltage of Vss (See (f) and (g) of FIG. 5) and a predetermined high voltage is applied to a selected word line WL (for example, WL0) for a predetermined period of time (See (h) of FIG. 5).

This operation may be carried out for all the memory cells M connected to the selected word line WL. This is because the threshold voltage of the flash cell section 12 of all the memory cells M are set to be low for allowing the DRAM operation. Here, in the case of the above-described non-destructive mode, although the non-volatile data are stored in the flash cell section 12, excessively high voltage would not usually be a problem if the data are to be renewed. Therefore, also in the non-destruction mode, initial application of the high voltage to the selected word line WL may be carried out for all the memory cells M.

In the fourth stage, the data temporarily stored in the memory cell M of the register section 11 are written into the flash cell section 12 of the memory cell M in the memory cell section 10 from which the data have been read out. Namely, after the precharging signal PRE of the precharging circuit 2 is raised for a predetermined period of time (See (c) of FIG. 5) to precharge all the bit lines BL to a voltage of Vcc/2 (See (f) and (g) of FIG. 5), a word line WL (for example, WLn+1) of the register section 10 in which the data are temporarily retreated is raised to a voltage of Vcc+Vth or more (See (i) of FIG. 5); the bit line separation signal CUT of the bit line selector 3 is lowered (See (e) of FIG. 5); and the sensing amplifier SA is actuated.

Thereafter, the reverse data transfer signal REV of the bit line selector 3 is raised (See (d) of FIG. 5) to return the reverse data of the result of sensing to the bit line BL, and a negative voltage is applied to a selected word line WL (for example, WL0) for a predetermined period of time (See (h) of FIG. 5). Here, if the result of sensing is "0", a voltage of Vcc is applied to the bit line BL, so that the threshold voltage of the flash cell section 12 of the selected memory cell M falls. On the other hand, if the result of sensing is "1", the bit line voltage is Vss, so that the threshold voltage of the flash cell section 12 of the selected memory cell M does not fall.

The storing operation for all the memory cells M is completed by carrying out the processes from the second stage to the fourth stage for all the word lines WL. Here, if the period of time required for raising the threshold voltage of the flash cell section 12 is shorter than the period of time required for lowering the threshold voltage, the above-described third stage can be omitted and it is sufficient to apply a predetermined high voltage to the word line WL in the fourth stage. This provides an advantage that the storing operation can be carried out at a higher speed.

Further, the storing operation will be unnecessary if the memory cells are operated in a non-destructive mode and the non-volatile data need not be renewed.

Verifying Operation

If the threshold voltage of the flash cell section 12 of the memory cells M in the memory cell section 10 or in the register section 11 is to be controlled, a verifying operation is needed for confirming whether the predetermined threshold voltage has been achieved or not, although it has been omitted in the above explanation of operations. This confirming operation (judgment) is carried out by conducting the processes up to the sensing amplifier operation of the third stage of the above-mentioned recalling operation.

Refreshing Operation

The refreshing operation has also been omitted in the above explanation of operations. However, the memory cells M operating as a DRAM need the refreshing operation. While the memory cells M are performing the reading operation or the writing operation as a DRAM, the refreshing operation is carried out from the system side in the same manner as in a general DRAM device, so that no problem will occur.

However, during the above recalling operation and the storing operation which the device, i.e. the non-volatile semiconductor memory device, automatically performs, the device itself must carry out the above refreshing operation periodically. Namely, the precharging signal PRE of the precharging circuit 2 is raised for a predetermined period of time to precharge all the bit lines to a voltage of Vcc/2; a predetermined word line WL is raised to a voltage of Vcc+Vth or more; the bit line separation signal CUT of the bit line selector 3 is lowered; the sensing operation is actuated; and thereafter the corresponding word line WL is lowered.

Actually, the refreshing operation is carried out periodically (for example, for every 250 $\mu$s) in the fourth stage of the above recalling operation for the memory cells M that have finished the recalling operation and in the third and fourth stages of the above storing operation for the memory cells M before the storing operation.

EXAMPLE 2

Figure 6:
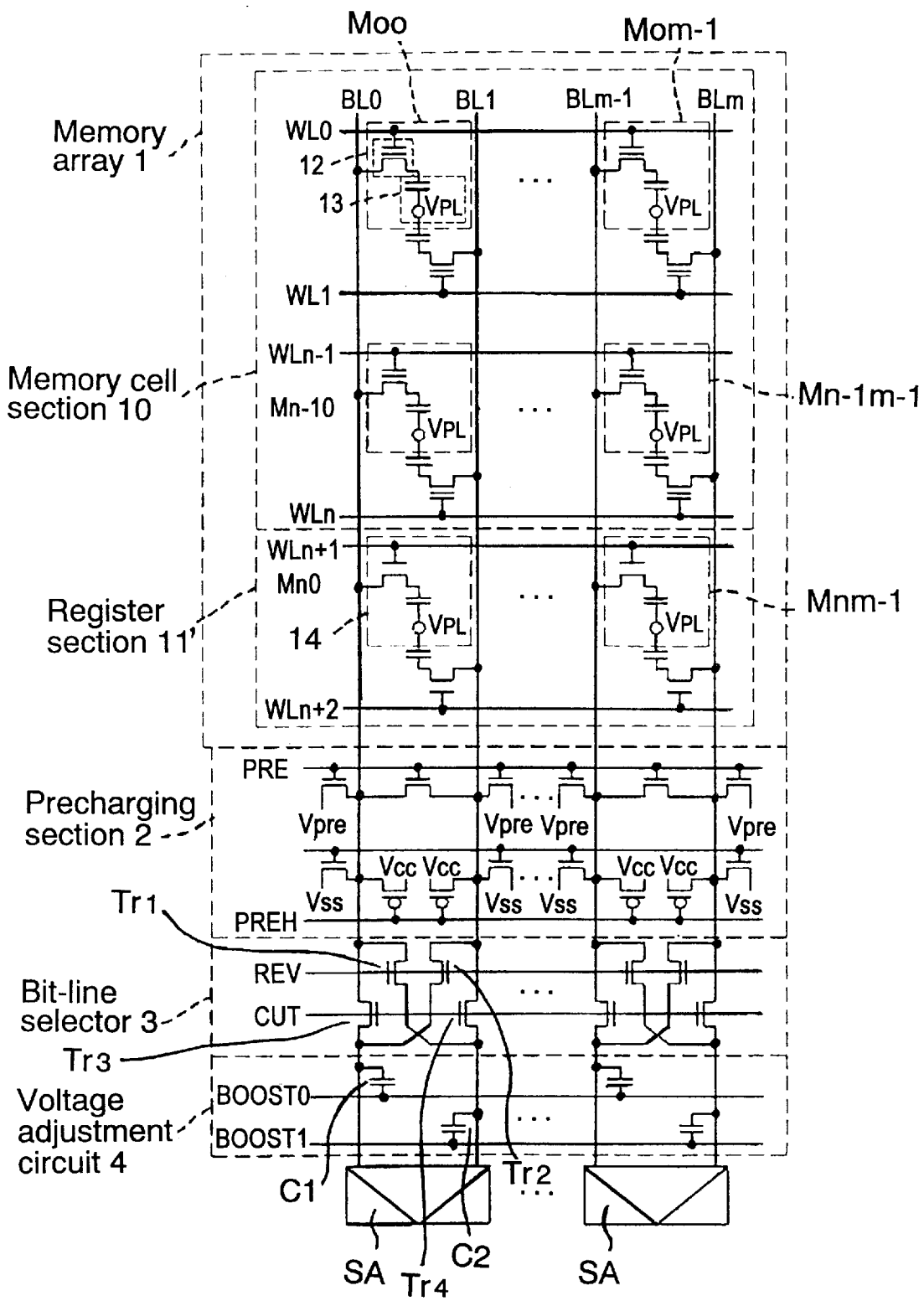
FIG. 6 is a circuit diagram showing a construction of another non-volatile semiconductor memory device according to the present invention.

The non-volatile semiconductor memory device according to a second embodiment of the present invention has the same structure as the non-volatile semiconductor memory device according to the first embodiment of the present invention except that the structure of the register section 11' is different, as shown in FIG. 6. Accordingly, like parts are represented by like symbols, and the explanation of the like parts will be omitted, so that only the different parts will be hereafter explained.

Referring to FIG. 6, the register section 11' according to the Example 2 of the present invention includes DRAM memory cells 14. Namely, the register section 11' includes DRAM memory cells 14 in which the flash cell section 12 is formed without a floating gate, while the register section 11 of the Example 1 includes a flash cell section 12 and a DRAM capacitor section 13 as a part of a memory array 1 in the same manner as the memory cell section 10.

According to the Example 2, the first stage of the above recalling operation and the storing operation can be omitted, thereby providing a non-volatile semiconductor memory device in which the operation can be carried out at a further higher speed.

Figure 2:
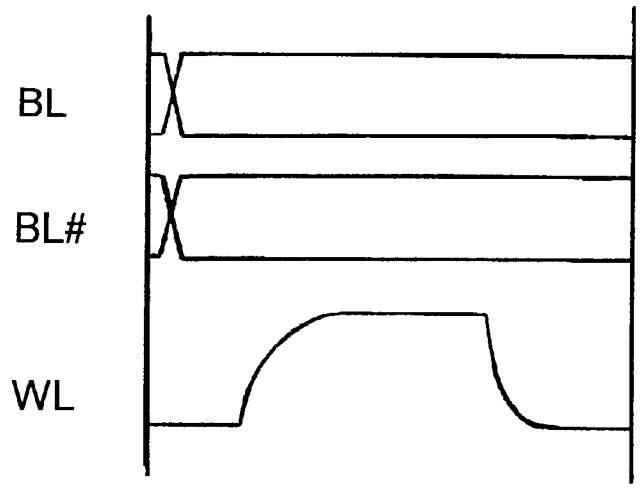
FIG. 2 is a timing chart showing a writing operation as a DRAM according to the present invention.

Here, from a practical point of view, the register section 11 or 11' is preferably constructed as a part of the memory array 1, as shown in FIG. 1 or FIG. 2, because the area occupied by the register section 11 or 11' with respect to the total chip area can be minimized.

Also, although the memory cells in the register section 11' are composed of DRAM memory cells 14 in the Example 2, the memory cells in the register section 11' may alternatively be composed of SRAM memory cells or other register circuits.

As is apparent from the above description of the preferred embodiments, the non-volatile semiconductor memory device of the present invention has a structure such that each of the memory cells includes a non-volatile memory cell and a capacitive element, whereby the non-volatile data can be stored in the non-volatile memory cell section and the volatile data can be stored in the capacitive element section. Therefore, in the normal operation mode, it is possible to achieve a high-speed random access similar to the one in a general DRAM by reading out or rewriting the volatile data stored in the capacitive element section. On the other hand, in the data retaining mode, final information or invariable information can be stored in the non-volatile memory cell section as non-volatile data.

Also, in the non-volatile semiconductor memory device of the present invention, data can be temporarily stored in the register section in performing conversion between the non-volatile data and the volatile data, namely, in the recalling operation in which the data in the non-volatile memory cell section are read out into the capacitive element section and in the storing operation in which the data in the capacitive element section are written into the non-volatile memory cell section. This provides an advantage that the recalling operation and the storing operation can be carried out at a high speed and with high reliability.

Further, the non-volatile semiconductor memory device of the present invention includes a bit line selector. This provides an advantage that the storing operation in which the temporarily stored data are stored into the non-volatile memory cell section, i.e. the operation of applying a reverse voltage of the sensed data can be facilitated. To be more specifically explained, in the storing operation, the reverse data of the result of sensing must be applied to the bit line BL in rewriting the data into the flash cell section. The reverse data can be easily applied to the bit line BL by allowing the REV signal to be a "H" level.

Also, the non-volatile semiconductor memory device of the present invention includes a voltage adjustment circuit. Accordingly, the data in the non-volatile memory section can be easily sensed by using a sensing amplifier which is generally used in a DRAM. Generally, a major method in sensing the non-volatile memory cell employs an electric current sensing operation using a reference cell. In this method, the data in the non-volatile memory cell section and the data in the capacitive element section must be frequently sensed in the recalling operation and in the storing operation. According to the non-volatile semiconductor memory device of the present invention, each of the data can be sensed by almost the same sensing operation using an ordinary sensing amplifier which is used in a general DRAM. This eliminates the need of providing an additional circuit element and provides an advantage in achieving a device operating at a higher speed and in reducing the size of the circuits.

Further, according to the first embodiment of the present invention, since the register section is composed of the same memory cells as used in the memory cell section, the area occupied by the register section with respect to the total chip area can be minimized, thereby providing an advantage that a non-volatile semiconductor memory device having a practical chip size can be realized.

Also, according to the second embodiment of the present invention, since the register section includes DRAM memory cells in which the memory cells in the memory cell section are formed without a floating gate, initialization of the register section is unnecessary in the recalling operation and in the storing operation, thereby providing an advantage that the operations can be performed all the more at a higher speed.

Further, the bit line selector includes transistors connecting a bit line to first and second input terminals of the sensing amplifier respectively, and transistors connecting another bit line, which is complementary to the above bit line, to the second and first input terminals of the sensing amplifier respectively. This provides an advantage that the storing operation in which the temporarily stored data are stored into the non-volatile memory cell section, i.e., the operation of applying a reverse voltage of the sensed data can be facilitated.

Also, since the voltage adjustment circuit includes capacitive elements respectively connected to the first and second input terminals of the sensing amplifier, a sensing amplifier for a general DRAM can be used for sensing the data in the non-volatile memory section of the present invention. This provides an advantage in achieving a device operating at a higher speed and in reducing the size of the circuits.

Although the present invention has fully been described by way of examples with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A non-volatile semiconductor memory device comprising:
   a memory cell section having a plurality of memory cells, each of the memory cells including a flash cell section and a DRAM capacitor section, the flash cell section having at least a drain, a source and a floating gate, the drain being connected to a bit line, the DRAM capacitor section having a capacitive element with two electrodes, one of the electrodes being connected to the source, and the other one of the electrodes being connected to a power supply terminal, and the memory cell being constructed in such a manner that electrons are injected into and extracted from the floating gate at least through the drain by a tunnel current;
   a register section connected to the memory cell section through the bit line;
   a bit line selector into which a signal from the bit line is input; and
   a sensing amplifier for receiving an output from the bit line selector as an input signal.

2. The non-volatile semiconductor memory device of claim 1, further comprising a voltage adjustment circuit for changing an input voltage of the sensing amplifier.

3. The non-volatile semiconductor memory device of claim 1 or 2, wherein the register section comprises a flash cell section and a DRAM capacitor section constituting a memory cell.

4. The non-volatile semiconductor memory device of claim 1 or 2, wherein the register section comprises a DRAM cell including a transistor and a capacitive element, the transistor being formed of a flash cell section without a floating gate.

5. The non-volatile semiconductor memory device of claim 1 or 2, wherein the bit line constitutes one of a pair of complementary bit lines.

6. The non-volatile semiconductor memory device of claim 5, wherein the bit line selector comprises:

a pair of transistors connecting one of the complementary bit lines to a first input terminal of the sensing amplifier and connecting the other one of the complementary bit lines to a second input terminal of the sensing amplifier, and another pair of transistors connecting the one of the complementary bit lines to the second input terminal of the sensing amplifier and connecting the other one of the complementary bit lines to the first input terminal of the sensing amplifier.

7. The non-volatile semiconductor memory device of claim 2, wherein the voltage adjustment circuit comprises capacitive elements respectively connected to first and second input terminals of the sensing amplifier.

* * * * *